(12) United States Patent
Fukuda

(10) Patent No.: US 7,710,812 B2
(45) Date of Patent: May 4, 2010

(54) SEMICONDUCTOR MEMORY DEVICE

(75) Inventor: Ryo Fukuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 31 days.

(21) Appl. No.: 12/137,065

(22) Filed: Jun. 11, 2008

(65) Prior Publication Data
US 2009/0016134 A1    Jan. 15, 2009

(30) Foreign Application Priority Data
Jun. 12, 2007    (JP) .............................. 2007-154962

(51) Int. Cl.
*G11C 7/00* (2006.01)
(52) U.S. Cl. ...................... 365/222; 365/207
(58) Field of Classification Search ................. 365/222, 365/207, 205
See application file for complete search history.

(56) References Cited

U.S. PATENT DOCUMENTS

| | | | | |
|---|---|---|---|---|
| 5,253,211 | A | * | 10/1993 | Suzuki ........................ 365/222 |
| 5,574,696 | A | * | 11/1996 | Murotani .................... 365/205 |
| 5,991,218 | A | | 11/1999 | Kushiyama et al. |
| 6,104,657 | A | * | 8/2000 | Haga .......................... 365/222 |
| 6,894,942 | B2 | * | 5/2005 | Cho ............................ 365/222 |

FOREIGN PATENT DOCUMENTS

| | | |
|---|---|---|
| JP | 2001-256778 | 9/2001 |
| JP | 2003-132682 | 5/2003 |
| JP | 2004-234713 | 8/2004 |

OTHER PUBLICATIONS

Takahi Ohsawa, "An 18.5ns 128Mb SOI DRAM with a Floating Body Cell", IEEE International Solid-State Circuits Conference, 2005, 3 Pages.

* cited by examiner

*Primary Examiner*—Anh Phung
(74) *Attorney, Agent, or Firm*—Oblon, Spivak, McClelland, Maier & Neustadt, L.L.P.

(57) ABSTRACT

A semiconductor memory device includes memory cells; word lines connected to gates of the cells; n bit lines connected to the memory cells; sense amplifiers connected to the bit lines; refresh cells provided to correspond to the word lines, respectively, and provided to correspond to k bit lines, where k is a natural number smaller than n, one of the refresh cells storing therein refresh data indicating whether to perform a refresh operation on k memory cells out of the plural memory cells connected to a corresponding word line out of the plural word lines and connected to the k bit lines, respectively; a refresh sense amplifier reading the refresh data; and a refresh selection part provided to correspond to the refresh sense amplifier, and selecting whether to perform the refresh operation on the k memory cells according to the refresh data read by the refresh sense amplifier.

13 Claims, 6 Drawing Sheets

FIRST EMBODIMENT

CYCLE COUNTER

SECOND EMBODIMENT

REFRESH SELECTION CIRCUIT

SEMICONDUCTOR MEMORY DEVICE

CROSS-REFERENCE TO RELATED APPLICATION

This application is based upon and claims the benefit of priority from the prior Japanese Patent Applications No. 2007-154962, filed on Jun. 12, 2007, the entire contents of which are incorporated herein by reference.

BACKGROUND OF THE INVENTION

1. Field of the Invention

The present invention relates to a semiconductor memory device.

2. Related Art

In recent years, there has been known an FBC (Floating Body Cell) memory as a semiconductor memory device expected to replace a DRAM. The FBC memory is configured to include field effect transistors (FETs) including floating bodies (hereinafter, also "bodies") on an SOI (Silicon On Insulator), respectively. The FBC memory stores data "1" or data "0" in each FBC according to the number of holes accumulated in the body thereof.

It is assumed, for example, that each memory cell is constituted by an NMOS, a state in which the number of holes accumulated in the body of the memory cell is large is data "1", and a state in which the number of holes accumulated in the body thereof is small is data "0". For the sake of convenience, the memory cell storing therein data "1" is referred to as ""1"cell" and the memory cell storing therein data "0" is referred to as ""0" cell", hereinafter. In the FBC memory, holes are accumulated in the body of each "0" cell through a source or drain diffusion layer, resulting in a "1" cell, or accumulated holes are emitted from the body of each "1" cell through the diffusion layer, resulting in a "0" cell. To deal with this, it is necessary to perform a refresh operation of reading data from each memory cell once and writing back data logically identical to the data to the memory cell.

However, in the conventional refresh operation, word lines are selected in order of addresses thereof, and the memory cells in all columns connected to each of the selected word lines are subjected to the refresh operation. Namely, the conventional refresh operation is performed regularly on all memory cells in a memory cell array irrespectively of whether each memory cell is good. The memory cells differ in data retention time depending on leakage characteristics and the like of their diffusion layers. Therefore, to refresh all the memory cells uniformly in a certain cycle means to consume unnecessary power in the refresh operation.

SUMMARY OF THE INVENTION

A semiconductor memory device according to an embodiment of the present invention comprises a plurality of memory cells storing data that is readable without data destruction; a plurality of word lines connected to gates of the plural memory cells; n bit lines connected to the memory cells, where n is an integer equal to or greater than 2; a plurality of sense amplifiers connected to the bit lines, respectively, and sensing the data stored in the memory cells; refresh cells provided to correspond to the word lines, respectively, and provided to correspond to k bit lines, where k is a natural number smaller than n, one of the refresh cells storing therein refresh data indicating whether to perform a refresh operation on k memory cells out of the plural memory cells connected to a corresponding word line out of the plural word lines and connected to the k bit lines, respectively; a refresh sense amplifier reading the refresh data; and a refresh selection part provided to correspond to the refresh sense amplifier, and selecting whether to perform the refresh operation on the k memory cells according to the refresh data read by the refresh sense amplifier.

A semiconductor memory device according to an embodiment of the present invention comprises a plurality of memory cells storing data that is readable without data destruction; a plurality of word lines connected to gates of the plural memory cells; n bit lines connected to the memory cells, where n is an integer equal to or greater than 2; a plurality of sense amplifiers connected to the bit lines, respectively, and sensing the data stored in the memory cells; a refresh register provided to correspond to a cell array connected to the plural word lines and connected to k bit lines out of the plural bit lines, where k is a natural number smaller than n, the refresh register storing therein refresh data indicating whether to perform a refresh operation on the memory cells in the cell array; and a refresh selection part provided to correspond to the refresh register, and selecting whether to perform the refresh operation on the memory cells in the cell array according to the refresh data stored in the refresh register.

A semiconductor memory device according to an embodiment of the present invention comprises a plurality of memory cells storing data that is readable without data destruction; a plurality of word lines connected to gates of the plural memory cells; n bit lines connected to the memory cells, where n is an integer equal to or greater than 2; a plurality of sense amplifiers connected to the bit lines, respectively, and sensing the data stored in the memory cells; refresh cells storing therein a refresh selection address allocated to k bit lines out of the plural bit lines corresponding to one of the word lines, where k is a natural number smaller than n; a refresh sense amplifier reading the refresh selection address from each of the refresh cells; a refresh decoder connected to the refresh sense amplifier, and decoding the refresh selection address; and a refresh selection part provided to correspond to the k bit lines, and selecting whether to perform the refresh operation on k memory cells out of the plural memory cells, the k memory cells being connected to a selected word line out of the plural word lines and connected to the k bit lines according to the refresh selection address.

DETAILED DESCRIPTION OF THE INVENTION

Embodiments of the present invention will be explained below in detail with reference to the accompanying drawings. Note that the invention is not limited thereto.

First Embodiment

Figure 1:
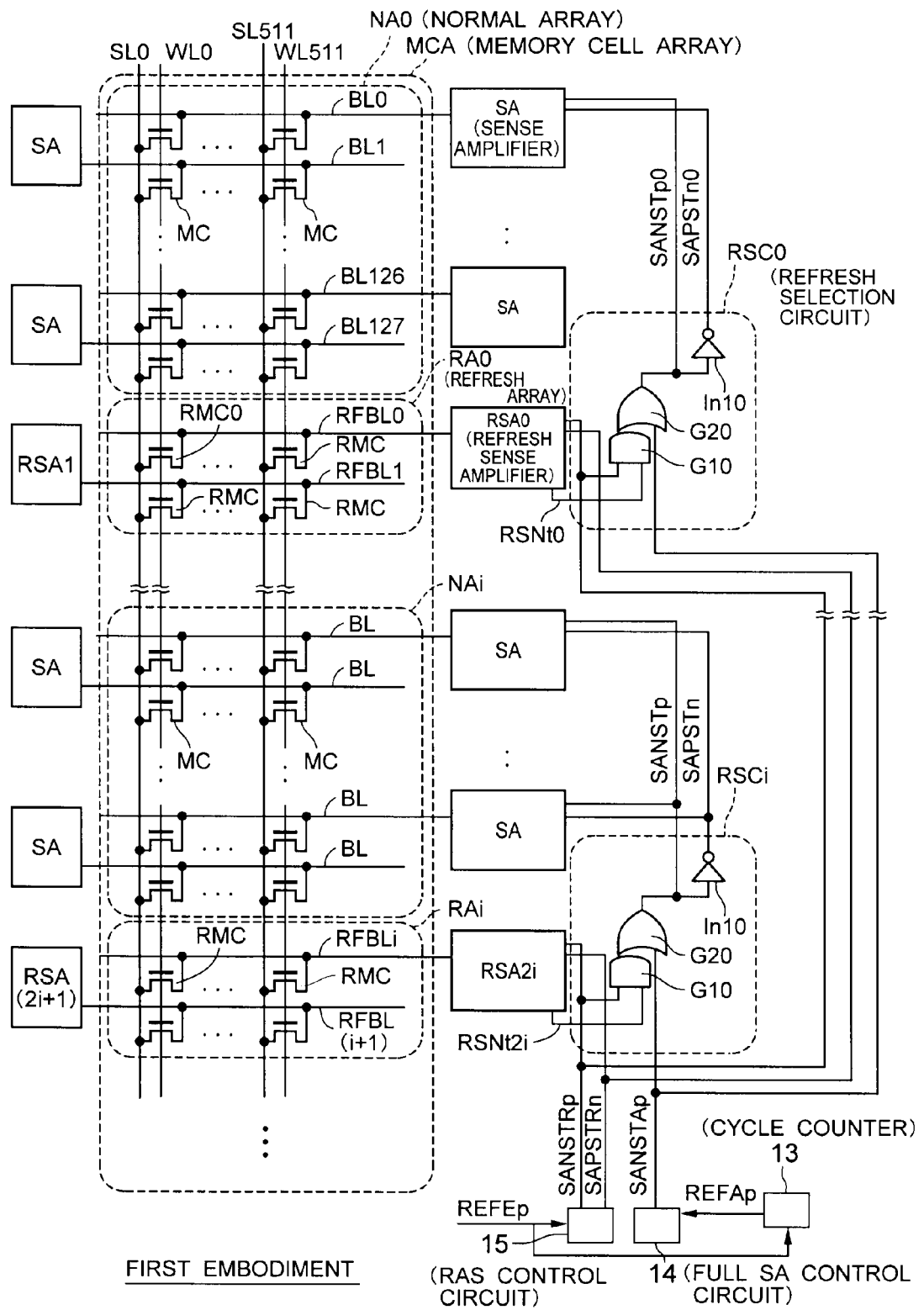
FIG. 1 is a schematic diagram showing an example of a configuration of an FBC memory according to a first embodiment of the present invention.

FIG. 1 is a schematic diagram showing an example of a configuration of an FBC memory according to a first embodiment of the present invention. A memory cell array MCA includes a plurality of normal arrays NA0 to NAn (hereinafter, also simply "NA") and a plurality of refresh arrays RA0 to RAn (hereinafter, also simply "RA"), where n is an integer equal to or greater than 2. Each normal array NAi ($0 \leq i \leq n$) includes normal memory cells (hereinafter, simply "memory cells") MC arranged two-dimensionally in a matrix. Each memory cell MC is an FBC constituted by an n-type FET including a floating body in an electrically floating state, and the FBC can store therein data according to the number of majority carriers accumulated in the floating body. Although the data stored in the FBC can be read without data destruction, the FBC needs to be regularly refreshed. The refresh operation is an operation of reading data from a memory cell MC once, latching the data to a sense amplifier SA, and writing back data logically identical to the data to the same memory cell MC, for example. However, the refresh operation is not limited to the operation described above. The memory cells MC constituting each normal array NA are used to store ordinary data.

A plurality of word lines WL extend in a row direction and are connected to gates of the memory cells MC. In the first embodiment, 512 word lines WL (WL0 to WL511) are provided. The word lines WL are common to the normal arrays NA0 to NAn and the refresh arrays RA0 to RAn. A plurality of bit lines BL extend in a column direction and are connected to drains of the memory cells MC. In one normal array NA, 128 bit lines BL are provided. Bit lines BL0 to BL127 are provided in the normal array NA0, and bit lines BL128 to BL255 (not shown) are provided in the normal array NA1. In the normal array NAi, bit lines BL(0+128$i$) to BL(127+128$i$) are provided. The word lines WL are substantially orthogonal to the bit lines BL and the memory cells MC are provided at crosspoints between the word lines WL and the bit lines BL, respectively. These memory cells MC are referred to as "crosspoint memory cells". Further, a plurality of source lines SL connected to sources of the memory cells MC extend along the word lines WL. In the first embodiment, 512 source lines (SL0 to SL511) are provided similarly to the word lines WL.

One sense amplifier SA is connected to each of the bit lines BL. The sense amplifier SA reads data stored in each memory cell MC or writes data to the memory cell MC. In the first embodiment, sense amplifiers SA are arranged on the left and right of the memory cell array MCA. The bit lines BL are alternately connected to the sense amplifiers SA on the same side, and two adjacent bit lines BL are connected to the sense amplifiers SA on different sides. Although similar circuits to refresh selection circuits RSC shown on the right of FIG. 1 are connected to the sense amplifiers SA shown on the left of FIG. 1, the refresh selection circuits RSC on the left side of FIG. 1 are not shown in FIG. 1 for the sake of convenience.

The refresh arrays RA are provided to correspond to the normal arrays NA. Each refresh array RA includes columns of refresh memory cells RMC provided to correspond to the word lines WL, respectively. In the first embodiment, the columns of the refresh memory cells RMC are provided to correspond to 64 bit lines BL. Accordingly, one refresh memory cell RMC corresponds to 64 memory cells MC connected to one word line WL connected to the same refresh memory cell RMC. For example, a refresh memory cell RMC0 shown in FIG. 1 corresponds to 64 memory cells MC provided at crosspoints between the word line WL0 and the bit lines BL0, BL2, BL4, . . . and BL126, respectively. Each refresh memory cell RMC stores therein refresh data RDATA indicating whether the 64 memory cells MC corresponding to the refresh memory cell RMC are to be refreshed.

One refresh array RA includes two columns of refresh memory cells RMC. For example, in the refresh array RA0, the refresh memory cells RMC in one column are connected to a refresh sense amplifier RSA0 via a refresh bit line RFBL0. The refresh memory cells RMC in the other column are connected to a refresh sense amplifier RSA1 via a refresh bit line RFBL1.

The refresh sense amplifier RSA0 corresponds to the 64 sense amplifiers SA arranged on the right of the memory cell array MCA. The refresh sense amplifier RSA1 corresponds to the 64 sense amplifiers SA arranged on the left of the memory cell array MCA. Similarly to the refresh sense amplifiers RSA0, each of the other refresh sense amplifiers RSAi corresponds to the 64 sense amplifiers SA. For brevity, the sense amplifiers SA and the like provided on the right of the normal array NA0 will be mainly described. Because the same thing is true for the other normal arrays NAi, the sense amplifiers SA and the like will not be described in respect of the other normal arrays NAi.

Each refresh memory cell RMC stores therein refresh data RDATA about 64 memory cells MC connected to the word line WL corresponding to the refresh memory cell RMC and connected to 64 bit lines BL, respectively. Generally, the leakage characteristics and the like of the diffusion layer of each memory cell MC are confirmed in advance by a test after manufacturing (post-manufacturing test). Due to this, each refresh data RDATA can be binary data preset by this test. Because the refresh data is preset, there is no need to rewrite data to each refresh memory cell RMC. The refresh memory cells RMC are, therefore, preferably constituted by nonvolatile memories (ROMs (Read Only Memories)). In this case, there is no need to perform a refresh operation on the refresh memory cells RMC themselves. Further, even when the FBC memory is turned off, the refresh data RDATA is not erased. However, the difference in configuration between the refresh memory cells RMC and the memory cells MC requires a complicated manufacturing process. On the contrary, the refresh memory cells RMC can be constituted by FBCs similarly to the memory cells MC. In this case, the refresh memories RMC can be formed simultaneously with formation of the memory cells MC, thereby making the manufacturing process simple. However, it is necessary to perform a refresh operation on the refresh memories RMC themselves. Furthermore, when the FBC memory is turned on, it is necessary to read refresh data RDATA and write the refresh data RDATA to each refresh memory cell RMC.

It may be explained that the FBC memory according to the first embodiment can select a part of a selected word line WL in one normal array NA, and perform the refresh operation only on the memory cells MC connected to the selected part of the word line WL. For example, when a part of the selected word line WL0 in the normal array NA0 is selected, 64 memory cells MC connected to the bit lines BL0, BL2, BL4, . . . and BL126 and to the word line WL0 are selectively subjected to the refresh operation. At this time, the other memory cells MC connected to the word line WL0 are not refreshed.

"Activation (active)" means turning on or driving of an element or a circuit, and "deactivation (inactive)" means turning off or stopping of an element or a circuit. It should be noted, therefore, that a HIGH (high potential level) signal is an activation signal on one occasion and a LOW (low potential level) signal is an activation signal on another occasion. For example, an NMOS transistor is activated by making a potential level of a gate thereof HIGH. A PMOS transistor is activated by making a potential level of a gate thereof LOW.

An operation of selectively refreshing one or a plurality of normal arrays NA in part of the columns in the memory cell array MCA as stated above will be referred to as "selective refresh operation" hereinafter. An operation of refreshing all the normal arrays NA in the memory cell array MCA as seen in the conventional technique will be referred to as "full refresh operation" hereinafter.

A cycle counter 13, a full SA control circuit 14, and a RAS control circuit 15 are provided to correspond to the memory cell array MCA. Namely, the cycle counter 13, the full SA control circuit 14, and the RAS control circuit 15 are used in common by the sense amplifiers SA and the refresh amplifiers RSA provided on the both sides of the memory cell array MCA.

The cycle counter 13 counts the number of times of activation of a refresh request signal REFEp (the number of times of execution of the refresh operation) so as to execute the full refresh operation once after executing the selective refresh operation predetermined times. The cycle counter 13 is reset when the refresh request signal REFEp has been activated predetermined times, and activates a full refresh request signal REAp once. For example, the cycle circuit 13 activates the full refresh request signal REAp once after ten times of activation of the refresh request signal REFEp. By doing so, nine out of the ten refresh operations become the selective refresh operations and one becomes the full refresh operation.

The full SA control circuit 14 activates a full refresh control signal SANSTAp in response to activation of the full refresh request signal REAp. The RSA control circuit 15 activates refresh control signals SANSTRp and SAPSTRn in response to activation of the refresh request signal REFEp.

Each refresh sense amplifier RSA reads refresh data RDATA stored in the refresh memory cells RMC via the refresh bit line RFBL connected to the refresh sense amplifier RSA. The refresh sense amplifiers RSA can be configured similarly to the sense amplifiers SA.

A refresh selection circuit RSC0, which is provided to correspond to the refresh sense amplifier RSA0, receives a refresh data read signal RSNt0 from the refresh sense amplifier RSA0. The refresh selection circuit RSC0 includes an AND gate G10, an OR gate G20, and an inverter In10. The AND gate G10 receives the refresh control signal SANSTRp and the refresh data read signal RSNt0, and outputs an operation result of an AND between the refresh control signal SANSTRp and the refresh data read signal RSNt0. The OR gate G20 receives an output from the AND gate G10 and the full refresh control signal SANSTAp, and outputs an operation result of an OR between the output from the AND gate G10 and the full refresh control signal SANSTAp. An output signal from the OR gate G20 and an inverted signal with respect to the output signal are used by the sense amplifiers SA corresponding to the refresh sense amplifier RSA0 as refresh permission signals SANSTp0 and SAPSTn0, respectively.

In the full refresh operation, the full refresh control signal SANSTAp is active (logically high). Due to this, the gate G20 activates the refresh permission signals SANSTp0 and SAPSTn0 irrespectively of signal levels of the refresh data read signal RSNt0 and the refresh control signal SANSTRp. Because the full refresh control signal SANSTAp is common to all refresh selection circuits RSC, the memory cells MC in all the normal arrays NA are refreshed.

In the selective refresh operation, the full refresh control signal SANSTAp is inactive. Due to this, the gate G20 activates the refresh permission signals SANSTp0 and SAPSTn0 only when both the refresh control signal SANSTRp and the refresh data read signal RSNt0 are active (logically high). Although the refresh control signal SANSTRp is common to all the refresh selection circuits RSC, the refresh data read signal RSNt0 depends on the refresh data RDATA0 stored in the refresh memory cells RMC. Due to this, the normal array NA0 can be selectively refreshed.

In this manner, in the selective refresh operation, the refresh selection circuit RSC0 determines whether to perform the refresh operation on the corresponding 64 memory cells MC according to the refresh data read signal RSNt0. When the refresh operation is performed on the corresponding memory cells MC, the refresh selection circuit RSC0 activates the refresh permission signals SANSTp0 and SAPSTn0 based on the refresh data read signal RSNt0. When the refresh operation is not performed on the corresponding memory cells MC, the refresh selection circuit RSC0 keeps the refresh permission signals SANSTp0 and SAPSTn0 inactive based on the refresh data read signal RSNt0. The other refresh selection circuits RSCi are similar in configuration and function to the refresh selection circuit RSC0.

By activation of the refresh permission signals SANSTp0 and SAPSTn0, each sense amplifier SA refreshes the memory cells MC via the bit line BL connected to the sense amplifier SA.

Figure 2:
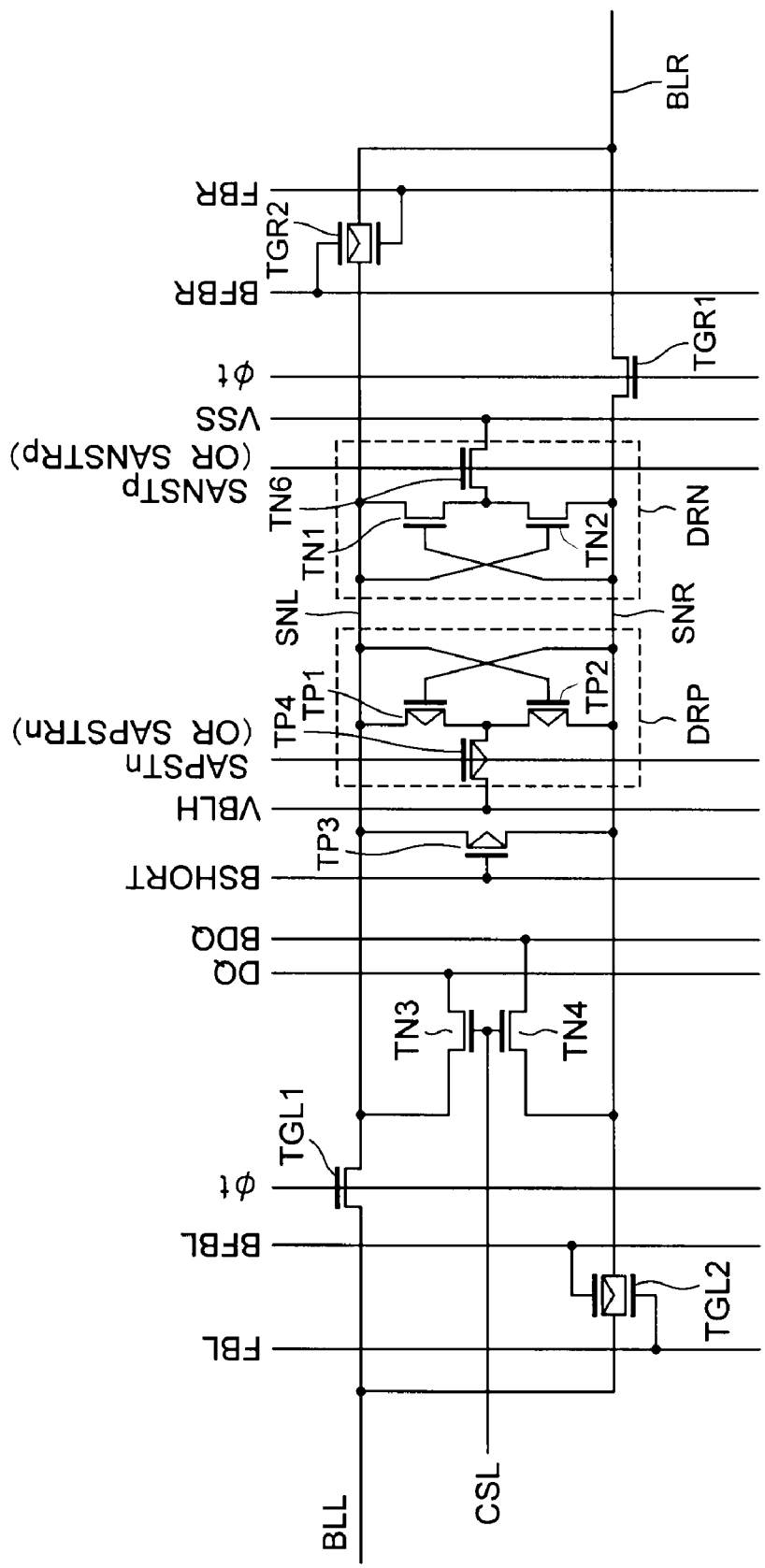
FIG. 2 is a circuit diagram showing an example of a configuration of the sense amplifier SA.

FIG. 2 is a circuit diagram showing an example of a configuration of the sense amplifier SA. The refresh sense amplifiers RSA differ from the sense amplifiers SA in that each refresh sense amplifier RSA receives the signals SAPSTRn and SANSTRp in place of the signals SAPSTn and SANSTp. The refresh sense amplifiers RSA are similar in other configurations to the sense amplifiers SA.

The sense amplifier SA is connected to one bit line BLL and one bit line BLR provided on the left and right of the sense amplifier SA, respectively. Namely, the sense amplifier SA adopts an open bit-line architecture. In the open bit-line architecture, another memory cell array MCA is provided on the other side of the sense amplifiers SA. In FIG. 1, the memory cell array MCA is shown only on one side of the sense amplifiers SA and the other memory cell array MCA is not shown. In case of the sense amplifier SA having the open bit-line architecture, when data is read, one of paired bit lines BLL and BLR transmits information data and the other transmits reference data.

The sense amplifier SA includes a pair of sense nodes SNL and SNR. The sense node SNL is connected to the bit line BLL via a transfer gate TGL1 and to the bit line BLR via a transfer gate TGR2. The sense node SNR is connected to the bit line BLR via a transfer gate TGR1 and to the bit line BLL via a transfer gate TGL2.

The transfer gates TGL1 and TGR1 are controlled to be turned on or off by a signal Φt. The transfer gate TGL2, which is a CMOS transfer gate, is controlled to be turned on or off by signals FBL and BFBL. The transfer gate TGR2, which is also a CMOS transfer gate, is controlled to be turned on or off by signals FBR and BFBR.

For example, when data "1" on the bit line BLL is to be detected, a threshold voltage of an n-type memory cell MC is reduced and therefore a potential of the sense node SNL is lower than that of the sense node SNR. When data "1" is to be written back to the memory cell MC, it is necessary to apply a high potential to the bit line BLL. Accordingly, by turning on the transfer gate TGL2, the sense node SNR having a high potential is connected to the bit line BLL.

The sense amplifier SA also includes cross-coupled dynamic latch circuits DRP and DRN. The dynamic latch circuit DRP is configured to include two p-type transistors TP1 and TP2 connected in series between the sense nodes SNL and SNR. A gate of the transistor TP1 is connected to the sense node SNR and that of the transistor TP2 is connected to the sense node SNL. Namely, the gates of the transistors TP1 and TP2 are cross-coupled to the sense nodes SNL and SNR. The dynamic latch circuit DRN is configured to include two n transistors TN1 and TN2 connected in series between the sense nodes SNL and SNR. A gate of the transistor TN1 is connected to the sense node SNR and that of the transistor TN2 is connected to the sense node SNL. Namely, the gates of the transistors TN1 and TN2 are cross-coupled to the sense nodes SNL and SNR.

The dynamic latch circuit DRP is connected to a high level potential VBLH used to write data "1" via a p-type transistor TP4. The dynamic latch circuit DRN is connected to a low level potential VSS used to write data "0" via an n transistor TN6. The p-type transistor TP4 and the n-type transistor TN6 are controlled by the signals SAPSTn and SANSTp, and driven by activation of the signals SAPSTn and SANSTp, respectively. Thus, the dynamic latch circuits DRP and DRN are controlled by the signals SAPSTn and SANSTp, respectively. The dynamic latch circuits DRP and DRN amplify potential differences from the paired sense nodes SNL and SNR and latch the potential differences to the paired sense nodes SNL and SNR, respectively. As can be seen, the signals SAPSTn and SANSTp are signals for causing the sense amplifier SA to execute a data read or write operation.

A p-type transistor TP3 serving as a short circuiting switch is connected between the sense nodes SNL and SNR, and controlled by a signal BSHORT. The transistor TP3 shorts the sense node SNL to the sense node SNR before the data read or write operation, thereby equalizing the sense node SNL to the sense node SNR.

An n-type transistor TN3 is connected between a DQ line and the sense node SNL, and an n-type transistor TN4 is connected between a BDQ line and the sense node SNR. Gates of the transistors TN3 and TN4 are connected to a column selection line CSL. The DQ line and the BDQ line are connected to a DQ buffer (not shown). The DQ buffer temporarily stores therein data from each memory cell MC to output the data to an outside of the FBC memory during the data read operation. Further, the DQ buffer temporarily stores therein data from the outside to transmit the data to the sense amplifier SA during the data write operation. Therefore, the column selection line CSL is activated when data is read to the outside or when data is written from the outside, and enables the sense nodes SNL and SNR to be connected to the DQ buffer.

Figure 3:
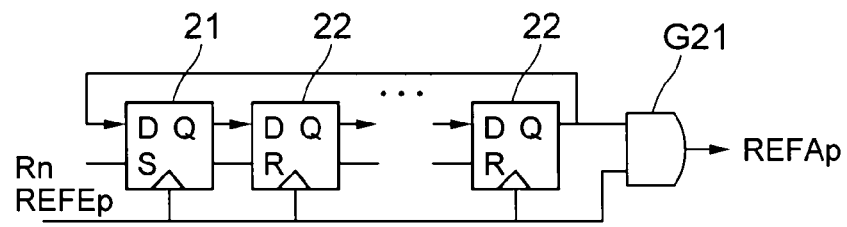
FIG. 3 is a circuit diagram showing an example of a configuration of the cycle counter 13.

FIG. 3 is a circuit diagram showing an example of a configuration of the cycle counter 13. The cycle counter 13 includes a flip-flop 21 having an SET input (hereinafter, "SET-input flip-flop 21"), flip flops 22 each having a RESET input (hereinafter, "RESET-input flip-flops 22"), and an AND gate G21.

The SET-input flip-flop 21 is a flip-flop holding a logically high level when a terminal S thereof becomes logically low, and used only as a flip-flop at a first stage. Each of the RESET-input flip-flops 22 is a flip-flop holding a logically low level when a terminal R thereof becomes logically low. The RESET-input flip-flops 22 are used as flip-flops at a second stage and the following stages.

The SET-input flip-flop 21 and the RESET-input flip-flops 22 are connected in series. An output from the flip-flop 22 at the last stage and the refresh request signal REFEp are input to the AND gate G21. An output signal from the AND gate G21 is output as a signal REFAp to the full SA control circuit 14 shown in FIG. 1. The output from the flip-flop 22 at the last stage is also fed back to the flip-flop 21 at the first stage. Each of the flip-flops 21 and 22 receives the signal REFEp as a clock and operates accordingly.

A signal Rn input to the flip-flop 21 is a signal that is logically low before the FBC memory is turned on and that is kept logically high after the FBC memory is turned on. Therefore, the flip-flop 21 initially holds "1 (logically high level)" and the other flip-flops 22 hold "0 (logically low level)". When the signal REFEp is activated, the flip-flop 21 outputs "1" from a terminal Q thereof and the other flip-flops 22 output "0" from terminals Q thereof, respectively. By so configuring, the flip-flop 22 at the second stage holds "1" and the other flip-flops 21 and 22 hold "0". When the signal REFEp is activated next time, the flip-flop 22 at the second stage outputs "1" and the flip-flop 22 at the third stage holds "1".

In this manner, whenever the signal REFEp is activated, "1" is fed to the flip-flop at the next stage in turn. When the flip-flop 22 at the last stage outputs "1", the signal REFAp is activated to be logically high and the flip-flop 21 holds "1" again. When one flip-flop 21 and nine flip-flops 22 are connected in series, for example, the cycle counter 13 activates the signal REFAp once whenever the signal REFEp is activated ten times.

Figure 4:
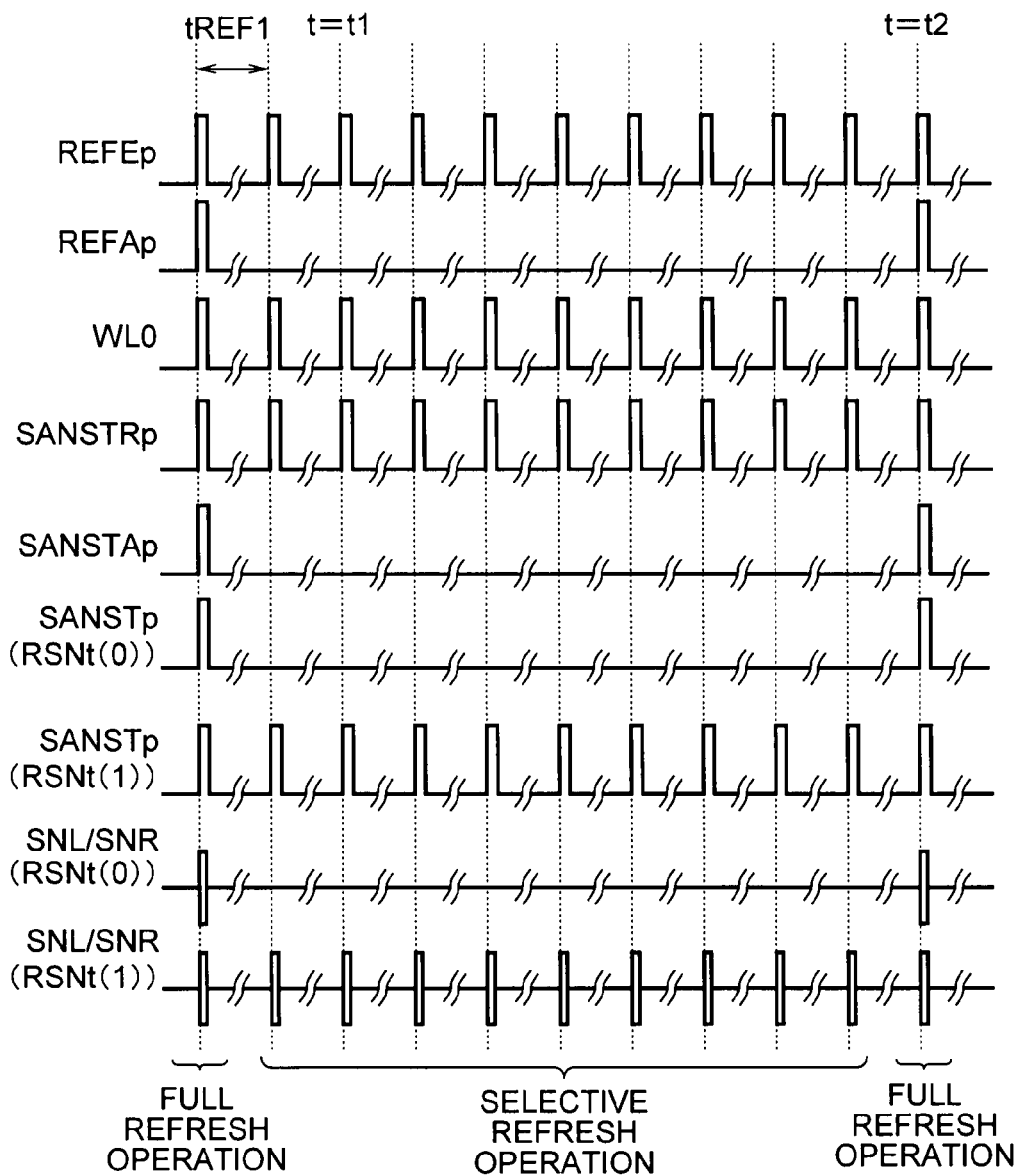
FIG. 4 is a timing chart showing an example of an operation performed by the FBC memory according to the first embodiment.

FIG. 4 is a timing chart showing an example of an operation performed by the FBC memory according to the first embodiment. FIG. 4 shows only the operation in relation to the word line WL0. The signal REFAp is activated once whenever the signal REFEp is activated ten times. In every cycle in which only the signal REFEp is activated, the selective refresh operation is executed. In every cycle in which both the signals REFEp and REFAp are activated, the full refresh operation is executed. With activation of at least one of the signals REFEp and REFAp, at least one of the signals SANSTRp and SANSTAp is activated. In FIG. 4, the signals REFEp and SANSTRp are activated simultaneously, and the signals REFAp and SANSTAp are activated simultaneously. However, the signals SANSTAp and SANSTRp are often activated by the full SA control circuit 14 and the RSA control circuit 15 to be delayed from activation of the signals REFAp and REFEp.

When the refresh data read signal RSNt is inactive ("0"), the refresh permission signal SANSTp (SANSTp (RSNt(0)) in FIG. 4) is activated only in the cycles in which the signal REFAp is activated. In this case, each of the sense amplifiers SA of the corresponding normal array NA activates the paired sense nodes SNL and SNR (SNL/SNR (RSNt(0))) in FIG. 4) only in the full refresh operation (only in the cycles in which the signal REFAp is activated).

When the refresh data read signal RSNt is active ("1"), the refresh permission signal SANSTp (SANSTp (RSNt(1)) in FIG. 4) is activated whenever the signal REFEp is activated. Therefore, each of the sense amplifiers SA of the corresponding normal array NA activates the paired sense nodes SNL and SNR (SNL/SNR (RSNt(1))) in FIG. 4) whenever the signal REFEp is activated. Namely, when the refresh data read signal RSNt is active, the sense amplifiers SA of the corresponding normal array NA refresh the memory cells MC in both the selective refresh operation and the full refresh operation.

For example, in a cycle t1, the selective refresh operation is executed. Accordingly, when the refresh data read signal RSNt is "1", 64 memory cells MC included in the corresponding normal array NA and connected to the selected word line WL0 are refreshed. In a cycle t2, the full refresh operation is executed. Accordingly, all the memory cells MC connected to the selected word line WL0 are refreshed.

In this manner, according to the first embodiment, in the selective refresh operation, a part of the memory cells MC among those connected to the selected word line WL can be selected, and the refresh operation can be performed only on the selected part of the memory cells MC. It is thereby possible to reduce current consumption in the refresh operation.

In the first embodiment, the refresh array RA, the refresh sense amplifiers RSA, and the refresh selection circuit RSC are provided to correspond to 64 bit lines BL. That is, k=64 in claims. Alternatively, the refresh array RA, the refresh sense amplifiers RSA, and the refresh selection circuit RSC can be provided to correspond to fewer bit lines BL than 64. In this alternative, the FBC memory can execute the selective refresh operation to correspond to a unit of memory cells MC fewer than 64. Conversely, the refresh array RA, the refresh sense amplifiers RSA, and the refresh selection circuit RSC can be provided to correspond to more bit lines BL than 64. In this another alternative, the numbers of arranged refresh arrays RA, refresh sense amplifiers RSA, and refresh selection circuits RSC are smaller, whereby it is possible to make the FBC memory smaller in circuit scale.

It is preferable that the refresh sense amplifiers RSA and the refresh selection circuit RSC be provided between the 64 sense amplifiers SA corresponding to a certain normal array NA and the 64 sense amplifiers SA corresponding to a normal array NA adjacent to the certain normal array NA. For example, there is known a technique of using not only gate wirings of the memory cells MC but also upper layer metal wirings as the word lines WL to reduce resistances of the word lines WL. In this case, each gate wiring is cut at intervals of a predetermined number of columns, and one end of the cut part is connected to the metal wiring via a contact. It is necessary to form contact formation regions (shunt regions) at intervals of predetermined number of columns. Each of these contact formation regions is arranged between one normal array NA corresponding to the sense amplifiers SA and another normal array NA adjacent to the normal array NA. By providing one refresh selection circuit RSC in each contact formation region, it is possible to suppress an increase in an overall area of the FBC memory.

Figure 5:
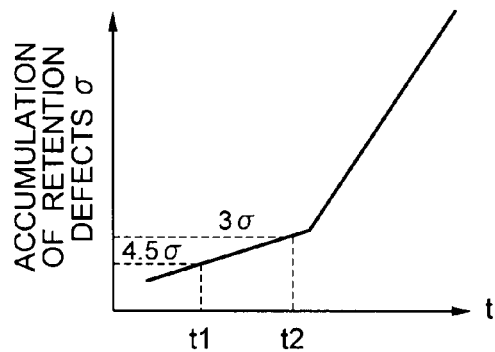
FIG. 5 is a graph showing a retention defect distribution of the memory cells MC storing therein data.

FIG. 5 is a graph showing a retention defect distribution of the memory cells MC storing therein data. This graph shows that accumulation of retention defects gradually increases relative to a leaving time t. For example, defective memory cells up to 4.5σ (memory cells that become defective until a leaving time t1) are replaced by redundant cells. Defective memory cells from 4.5σ to 3σ (memory cells that become defective until a leaving time t2) are subjected to the selective refresh operation, and refreshed whenever the signal REFEp is activated. Further, defective memory cells equal to or greater than 3σ (memory cells that remain good until the leaving time t2) are subjected to the full refresh operation and refreshed whenever the signal REFAp is activated. By so setting, a memory cell refresh frequency can be changed according to the retention times of the memory cells MC.

In the first embodiment, the sense amplifiers SA subjected to the selective refresh operation are selected according to logic levels of the refresh permission signals SAPSTn and SANSTp. The refresh permission signals SAPSTn and SANSTp are used to detect data stored in each memory cell MC and to activate the dynamic latch circuits DRP and DRN amplifying the data. Alternatively, each of the sense amplifiers SA subjected to the selective refresh operation can use the feedback signals FBL, BFBL, FBR, and BFBR for connecting the bit lines BL to the sense nodes SNL and SNRk in place of the refresh permission signals SAPSTn and SANSTp.

In this alternative, in each of the sense amplifiers SA subjected to the selective refresh operation, the feedback signals FBL, BFBL, FBR, and BFBR are activated, and the transfer gates TGL2 and TGR2 connect the bit lines BL to the sense nodes SNL and SNR. The refresh operation is thereby performed. In each of the sense amplifiers SA not subjected to the selective refresh operation, the feedback signals FBL, BFBL, FBR, and BFBR are inactive. Accordingly, the refresh operation is not performed on the memory cells MC because the transfer gates TGL2 and TGR2 disconnect the sense nodes SNL and SNR from the bit lines BL although the sense amplifier SA is driven. As can be seen, even when the feedback signals FBL, BFBL, FBR, and BFBR are used, the advantages of the present invention can be maintained.

Second Embodiment

Figure 6:
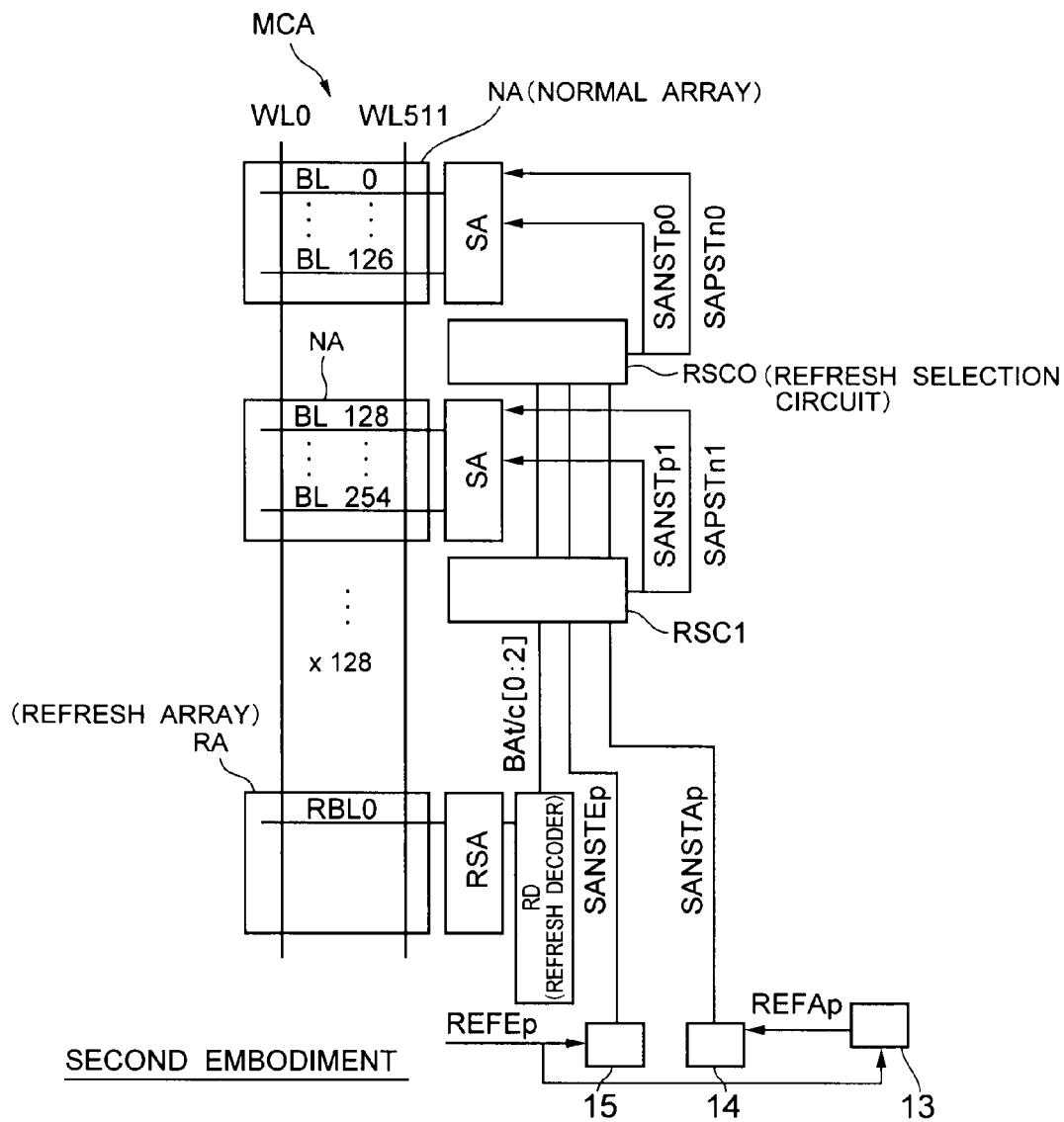
FIG. 6 is a schematic diagram showing an example of a configuration of an FBC memory according to a second embodiment of the present invention.

FIG. 6 is a schematic diagram showing an example of a configuration of an FBC memory according to a second embodiment of the present invention. In the second embodiment, a refresh array RA is provided to correspond to one memory cell array MCA, and common to all the normal arrays NA in the memory cell array MCA. Further, refresh selection addresses indicating whether or not the normal arrays NA are to be refreshed in the selective refresh operation are allocated to the normal arrays NA, respectively. The refresh array RA stores therein these refresh selection addresses and outputs the refresh selection addresses during the refresh operation.

Each refresh selection address is configured to include data of three bits. Therefore, the FBC memory according to the second embodiment can set a maximum of eight normal arrays NA as those to be refreshed in the selective refresh operation. Needless to say, by configuring the refresh selection address to include data of four bits or more, the FBC memory can set eight or more normal arrays NA as those to be refreshed in the selective refresh operation. Conversely, when the number of retention defects is small, the refresh selection address can be configured to include data of two bits or less. It is thereby possible to simplify configurations of the refresh array RA and the like.

The normal arrays NA, the sense amplifiers SA, the cycle counter 13, the full SA control circuit 14, and the RSA control circuit 15 according to the second embodiment can be configured similarly to those according to the first embodiment.

Figure 7:
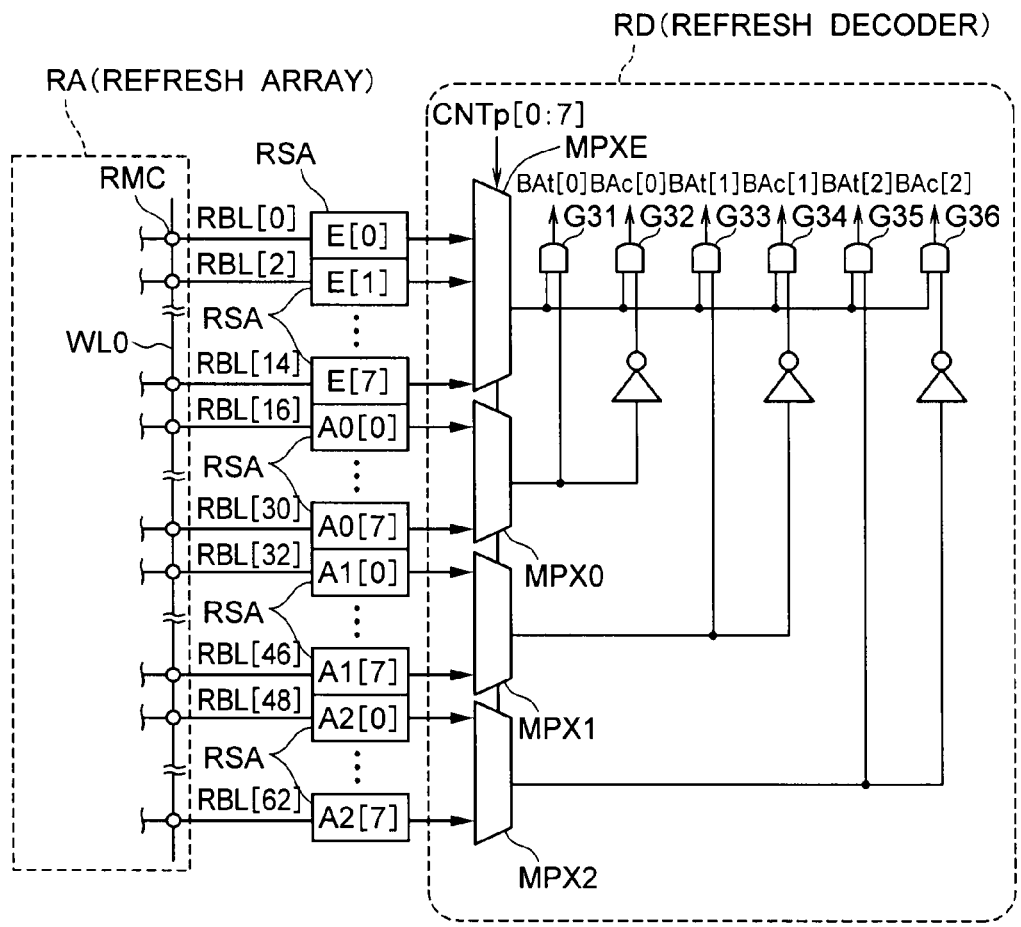
FIG. 7 is a schematic diagram showing an example of configurations of the refresh array RA, the refresh sense amplifiers RSA, and a refresh decoder RD.

FIG. 7 is a schematic diagram showing an example of configurations of the refresh array RA, the refresh sense amplifiers RSA, and a refresh decoder RD. In FIG. 7, only the word line WL0 and the refresh memory cells RMC connected to the word line W0 are shown while the other word lines WL and refresh memory cells RMC are not shown.

Each of the refresh memory cells RMC stores therein the refresh selection addresses of three bits allocated to correspond to 64 memory cells MC. For each word line WL, 64 refresh memory cells RMC are provided. Accordingly, the refresh array RA includes 64 columns of refresh memory cells RMC. The refresh memory cells RMC in each column are connected to refresh bit lines RBL0 to RBL63, respectively. Each refresh bit line RBL is connected to one refresh sense amplifier RSA.

Out of the 64 columns, 32 columns correspond to the sense amplifiers SA arranged on the right of the memory cell array MCA whereas the remaining 32 columns correspond to the sense amplifiers SA arranged on the left of the memory cell array MCA. The 32 columns corresponding to the sense amplifiers SA arranged on the right of the memory cell array MCA will now be described. Because the 32 columns corresponding to the sense amplifiers SA arranged on the left of the memory cell array MCA are similar to those on the right of the memory cell array MCA, they will not be described herein.

The refresh sense amplifiers RSA shown in FIG. 7 are connected to 32 refresh bit lines RBL0, RBL2, RBL4, ... and RBL62 and output 32 refresh selection address signals E(0) to E(7), A0(0) to A0(7), A1(0) to A1(7), and A2(0) to A2(7), respectively.

The refresh decoder RD includes multiplexers MPXE to MPX2 and AND gates G31 to G36. Eight refresh sense amplifiers RSA are connected to each of the multiplexers MPXE to MPX2. The multiplexer MPXE outputs one of the permission signals E(0) to E(7) to the gates G31 to G36 according to a signals CNTp(0) to CNTp(7). The multiplexer MPX0 outputs one of the address signals A0(0) to A0(7) to the gate G31 and outputs an inverted signal with respect to the output signal to the gate G32 according to the signals CNTp(0) to CNTp(7). The multiplexer MPX1 outputs one of the address signals A1(0) to A1(7) to the gate G33 and outputs an inverted signal with respect to the output signal to the gate G34 according to the signals CNTp(0) to CNTp(7). The multiplexer MPX2 outputs one of the address signals A2(0) to A2(7) to the gate G35 and outputs an inverted signal with respect to the output signal to the gate G36 according to the signals CNTp(0) to CNTp(7).

One of the permission signals E(0) to E(7) and one of the refresh selection address signals A0(0) to A2(7) (and inverted signals with respect to the refresh selection address signals A0(0) to A2(7)) are input to each of the gates G31 to G36. The gates G31 to G36 output refresh selection address signals BAt(0) to BAt(2) and BAc(0) to BAc(2) to the refresh control circuit RSC1, respectively. In this manner, the refresh decoder RD decodes the refresh selection address signals A2(0) to A2(7) and outputs the refresh selection address signals BAt(0) to BAt(2) and BAc(0) to BAc(2).

The refresh selection address signals E(0) to E(7), A0(0) to A0(7), A1(0) to A1(7), and A2(0) to A2(7), and the refresh selection address signals BAt(0) to BAt(2) and BAc(0) to BAc(2) will now be described. The address signals {A0(0), A1(0), A2(0)} signify an address indicating one normal cell array NA to be subjected to the selective refresh operation. The signal E(0) corresponding to {A0(0), A1(0), A2(0)} is an enable signal permitting output of the address signals {A0(0), A1(0), A2(0)}. Further, the address signals {A0(1), A1(1), A2(1)} indicate one normal cell array NA to be subjected to the selective refresh operation. The signal E(1) corresponding to {A0(1), A1(1), A2(1)} is an enable signal permitting output of the address signals {A0(1), A1(1), A2(1)}. Likewise, the address signals {A0(i), A1(i), A2(i)} (0≦i≦7) indicate one normal cell array NA to be subjected to the selective refresh operation. The signal E(i) corresponding to {A0(i), A1(i), A2(i)} is an enable signal permitting output of the address signals {A0(i), A1(i), A2(i)}.

It is assumed, for example, that the signals E(0) and E(1) are "1 (active)" and that the signals E(2) to E(7) are "0 (inactive)". In this case, the normal arrays NA subjected to the selective refresh operation are two normal arrays NA designated by the address signals {A0(0), A1(0), A2(0)} and {A0(1), A1(1), A2(1)} corresponding to the permission signals E(0) and E(1), respectively. This indicates that the number of normal arrays NA determined to have retention defects except for the normal arrays NA dealt with by redundancy is two.

The signal CNTp selects one of (0) to (7) in turn. When the signal CNTp selects (i), the multiplexers MPXE to MPX2 output E(i), A0(i), A1(i), and A2(i), respectively. When the signal CNTp selects (0), the multiplexers MPXE to MPX2 output E(0), A0(0), A1(0), and A2(0), respectively.

Because the permission signal E(0) is "1", the gates G31 to G36 can output {A0(0), A1(O), A2(0)}. At this time, the gates G31 to G36 output the signal A0(0), an inverted signal with respect to the signal A0(O), A1(0), an inverted signal with respect to the signal A1(0), A2(0), and an inverted signal with respect to the signal A2(0) as the address signals BAt(0), BAc(0), BAt(1), BAc(1), BAt(2), and BAc(2), respectively.

Because the permission signal E(1) is also "1", the gates G31 to G36 can output {A0(1), A1(1), A2(1)}. At this time, the address signals BAt(0), BAc(0), BAt(1), BAc(1), BAt(2), and BAc(2) generated to correspond to {A0(1), A1(1), A2(1)} are input to the refresh selection circuit RSC shown in FIG. 8 to select normal arrays NA to be subjected to the selective refresh operation.

Because the permission signals E(2) to E(7) are "0", the gates G31 to G36 cannot output {A0(2), A1(2), A2(2)} to {A0(7), A1(7), A2(7)}. Therefore, the selective refresh operation is not executed at this time.

Figure 8:
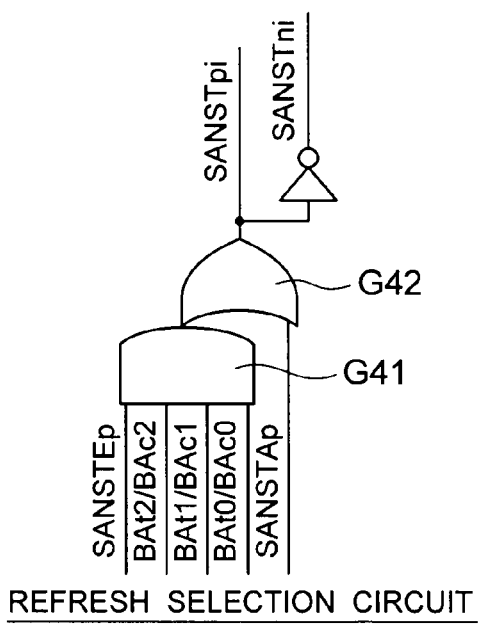
FIG. 8 is a circuit diagram showing an example of a configuration of one refresh selection circuit RSC.

FIG. 8 is a circuit diagram showing an example of a configuration of one refresh selection circuit RSC. The refresh selection circuit RSC is provided to correspond to 64 bit lines BL in each normal array NA, and determines whether to perform the selective refresh operation on the 64 memory cells MC connected to the selected word line WL and to the 64 bit lines BL, respectively, based on the refresh selection addresses.

The refresh selection circuit RSC includes an AND gate G41 and an OR gate G42. The gate G41 receives the refresh control signal SANSTEp and three bits out of the address signals BAt(0), BAc(0), BAt(1), BAc(1), BAt(2), and BAc(2), and outputs an operation result of an AND among these signals. The gate G42 receives an output from the gate G41 and the full refresh control signal SANSTAp, and outputs an operation result of an OR between the output and the full refresh control signal SANSTAp. An output signal from the gate G42 and an inverted signal with respect to the output signal are used by each sense amplifier SA as the refresh permission signals SANSTp and SAPSTn, respectively.

As shown in FIG. 6, the refresh selection circuits RSC are provided to correspond to the normal arrays NA, respectively and receive address signals of three bits different from one another. However, a first bit of the 3-bits address signals is BAt(0) or BAc(0), a second bit thereof is BAt(1) or BAc(1), and a third bit thereof is BAt(2) or BAc(2). It is to be noted that BAc(i) is an inverted signal with respect to the address signal BAt(i). Accordingly, eight normal arrays NA can be selected by the address signals BAt(0), BAc(0), BAt(1), BAc(1), BAt(2), and BAc(2).

In the selective refresh operation, address signals {1, 1, 1} are input to each of the refresh selection circuits RSC connected to the normal arrays NA to be refreshed. A case in which the normal array NA receiving, for example, addresses {BAt(0), BAc(1), BAt(2)} is registered to addresses {A0(1), A1(1), A2(1)} as the normal array NA to be subjected to the selective refresh operation will be considered. In this case, data "1" is stored in the refresh memory cell RMC corresponding to the permission signal E(1). Further, data "1", "0", and "1" are stored in the refresh memory cells RMC corresponding to the addresses {A0(1), A1(1), A2(1)}, respectively. The reason for storing the data "0" in the refresh memory cell RMC corresponding to the address A1(1) is that the address signal BAc(1) input to the refresh selection circuit RSC is the inverted signal with respect to the signal A1(1). As a result, the signals {BAt(0), BAc(1), BAt(2)} become {1, 1, 1}, so that the refresh selection circuit RSC can activate the signals SANSTp and SAPSTn. A method of allocating the address signals BAt(0)/BAc(0), BAt(1)/BAc(1), and BAt(2)/BAc(2) is not limited to a specific one as long as the normal arrays NA can be identified by the address signals.

An operation performed by the FBC memory according to the second embodiment will be briefly described. Because a timing chart according to the second embodiment is almost similar to that shown in FIG. 4, it is not shown herein. An operation in relation to the refresh control signal SANSTEp is similar to that in relation to the refresh control signal SANSTRp according to the first embodiment.

In the selective refresh operation, the multiplexers MPXE to MPX2 shown in FIG. 7 transmit signals E(i), A0(i), A1(i), and A2(i) to the gates G31 to G36 in turn for every "i". When the permission signal E(i) is active, the gates G31 to G36 output the refresh selection address signals {A0(i), A1(i), A2(i)} as the address signals BAt(0), BAc(0), BAt(1), BAc (1), BAt(2), and BAc(2).

The address signals BAt(0), BAc(0), BAt(1), BAc(1), BAt(2), and BAc(2) are output to each refresh selection circuit RSC. The refresh selection circuit RSC receives one bit from the address signal BAt(0)/BAc(0), one bit from the address signal BAt(1)/BAc(1), and one bit from the address signal BAt(2)/BAc(2), i.e., three bits in all. When the address signals of three bits are all active (111) and the refresh control signal SANSTEp is active, the refresh selection circuit RSC activates the refresh permission signals SANSTpi and SAPSTni.

In the full refresh operation, the full refresh control signal SANSTAp is active. Due to this, irrespectively of the logic of the output from the gate G41, the refresh selection circuit RSC activates the refresh permission signals SANSTpi and SAPSTni. Because the full refresh control signal SANSTAp is common to all the refresh selection circuits RSC, all the normal arrays NA are subjected to the refresh operation.

In this manner, according to the second embodiment, the normal arrays NA to be subjected to the selective refresh operation can be designated by the addresses of three bits. According to the second embodiment, therefore, similarly to the first embodiment, the refresh operation can be performed only on a part of memory cells MC among those connected to the selected word line WL. It is thereby possible to reduce current consumption in the refresh operation.

Each refresh selection circuit RSC can be formed in one contact formation region (shunt region) as described in the first embodiment. It is thereby possible to suppress an increase in an overall area of the FBC memory.

In the second embodiment, the refresh selection circuits RSC are provided to correspond to 64 bit lines BL. That is, k=64 in claims. Alternatively, the refresh selection circuits RSC can be provided to correspond to fewer bit lines BL than 64. In this alternative, the FBC memory can execute the selective refresh operation to correspond to a unit of memory cells MC fewer than 64.

Third Embodiment

According to the first embodiment, it is determined whether to perform the selective refresh operation for every word line in one block. According to a third embodiment of the present invention, by contrast, it is simply determined whether to perform the selective refresh operation for all the word lines WL.

Figure 9:
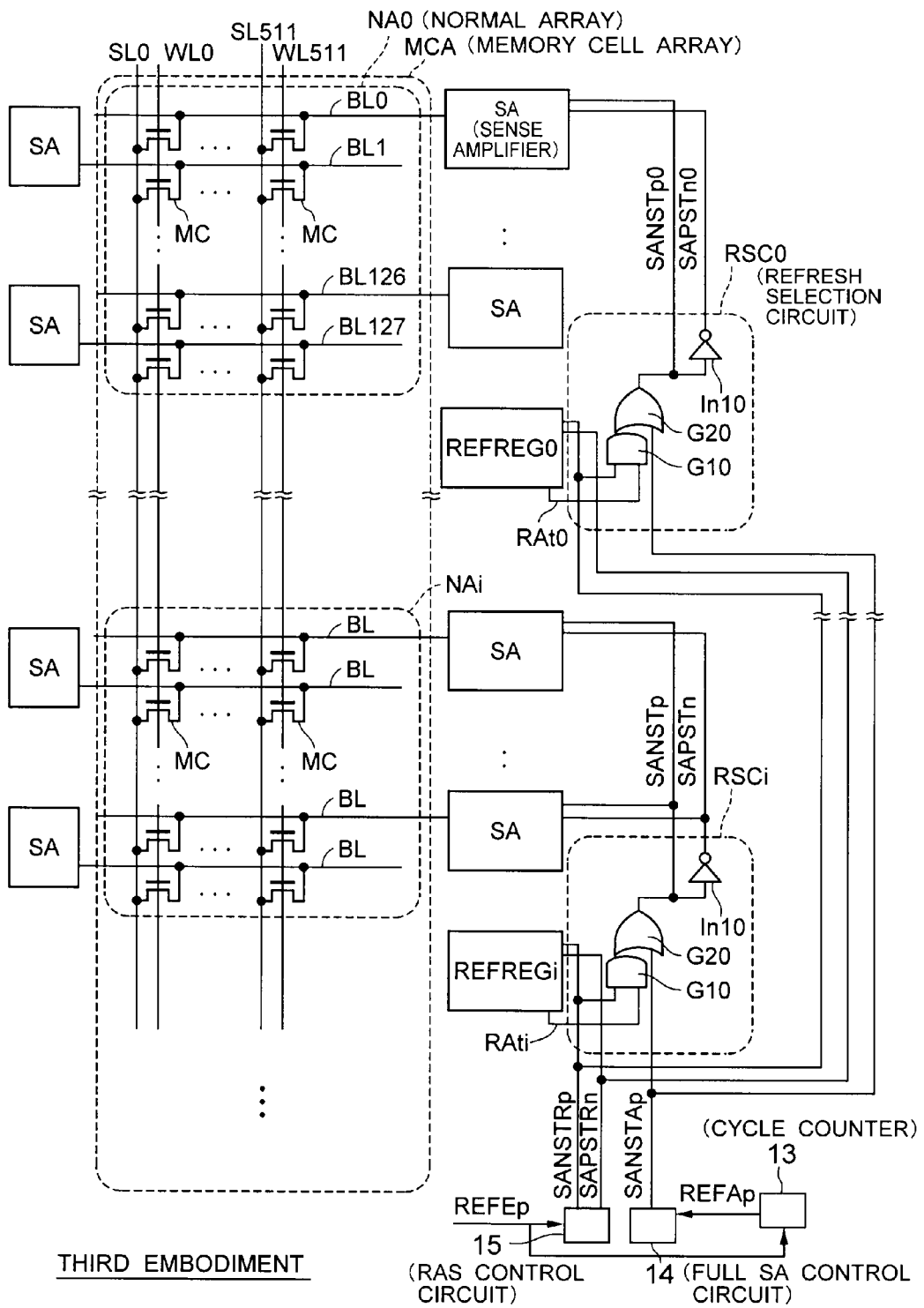
FIG. 9 is a schematic diagram showing an example of a configuration of an FBC memory according to the third embodiment.

FIG. 9 is a schematic diagram showing an example of a configuration of an FBC memory according to the third embodiment. As shown in FIG. 1, the FBC memory according to the first embodiment includes one refresh array RA and the refresh sense amplifiers RSA to correspond to one normal array NA. As shown in FIG. 9, the FBC memory according to the third embodiment includes no refresh array RA and no refresh sense amplifier RSA but includes refresh registers REFREGi (0≦i≦n) to correspond to the normal arrays NA, respectively, in place of the refresh array RA and refresh sense amplifier RSA.

Each refresh register REFREG outputs a signal RAti indicating whether to selectively refresh the entire normal array NA. The signal RAti is used by the corresponding refresh selection circuit RSC. The refresh selection circuits RSC according to the third embodiment are similar in configuration and operation to those according to the first embodiment.

When a memory cell MC having a retention defect is included (or a predetermined number of or more memory cells MC each having a retention defect are included) in a certain normal array NA, the refresh register REFREG corresponding to the normal array NA activates the signal RAt to be logically high. Conversely, when no memory cell MC having a retention defect is included (or less than a predetermined number of memory cells MC each having a retention defect are included) in a certain normal array NA, the refresh register REFREG corresponding to the normal array NA deactivates the signal RAt to be logically low.

In the third embodiment, it is possible to reduce nonvolatile data indicating whether it is necessary to perform the selective refresh operation. In the third embodiment, by adding the refresh registers REFREG, it is possible to eliminate the refresh arrays RA and the refresh sense amplifiers RSA that are larger in circuit scale than the refresh registers REFREG. However, in the FBC memory according to the third embodiment, it is determined whether to perform the selective refresh operation for every normal array NA (e.g., 512×64=32 kbite). Due to this, the number of memory cells MC subjected to the selective refresh operation may possibly increase. In this case, the effect of reducing current consumption is smaller. The third embodiment is effective for purposes for which the current consumption is not so strictly specified.

The invention claimed is:

1. A semiconductor memory device comprising:
   a plurality of memory cells storing data that is readable without data destruction;
   a plurality of word lines connected to gates of the plural memory cells;
   n bit lines connected to the memory cells, where n is an integer equal to or greater than 2;
   a plurality of sense amplifiers connected to the bit lines, respectively, and sensing the data stored in the memory cells;
   refresh cells provided to correspond to the word lines, respectively, and provided to correspond to k bit lines, where k is a natural number smaller than n, one of the refresh cells storing therein refresh data indicating whether to perform a refresh operation on k memory cells out of the plural memory cells connected to a corresponding word line out of the plural word lines and connected to the k bit lines, respectively;
   a refresh sense amplifier reading the refresh data; and
   a refresh selection part provided to correspond to the refresh sense amplifier, and selecting whether to perform the refresh operation on the k memory cells according to the refresh data read by the refresh sense amplifier.

2. The semiconductor memory device according to claim 1, wherein
the refresh selection part and the refresh sense amplifier are provided between one group of the sense amplifiers connected to the k bit lines and another group of the sense amplifiers adjacent to the one group of the sense amplifiers, and
contacts connecting the word lines to metal wirings provided on an upper layer than the word lines are provided between a cell array corresponding to the one group of the sense amplifiers and a cell array corresponding to the adjacent group of the sense amplifiers.

3. The semiconductor memory device according to claim 1, wherein
the refresh selection part selects whether to perform the refresh operation using a refresh permission signal for causing the sense amplifiers to execute a data read operation or a data write operation.

4. The semiconductor memory device according to claim 1, further comprising a counter provided to correspond to the plural refresh selection parts, and counting a number of times of executing the refresh operation, wherein
all of the plural refresh selection parts corresponding to the counter perform the refresh operation when the number of times of executing the refresh operation reaches a predetermined value.

5. The semiconductor memory device according to claim 1, wherein
the refresh data is determined based on a length of a retention time which is a term from writing data into the memory cells until the memory cells storing the data therein has a retention defect.

6. The semiconductor memory device according to claim 4, wherein
the refresh data is determined based on a length of a retention time which is a term from writing data into the memory cells until the memory cells storing the data therein has a retention defect.

7. The semiconductor memory device according to claim 1, further comprising transfer gates connected between the sense amplifiers and the bit lines, wherein
the refresh selection part selects whether to perform the refresh operation by conductive states of the transfer gates.

8. A semiconductor memory device comprising:
a plurality of memory cells storing data that is readable without data destruction;
a plurality of word lines connected to gates of the plural memory cells;
n bit lines connected to the memory cells, where n is an integer equal to or greater than 2;
a plurality of sense amplifiers connected to the bit lines, respectively, and sensing the data stored in the memory cells;
refresh cells storing therein a refresh selection address allocated to k bit lines out of the plural bit lines corresponding to one of the word lines, where k is a natural number smaller than n;
a refresh sense amplifier reading the refresh selection address from each of the refresh cells;
a refresh decoder connected to the refresh sense amplifier, and decoding the refresh selection address; and
a refresh selection part provided to correspond to the k bit lines, and selecting whether to perform the refresh operation on k memory cells out of the plural memory cells, the k memory cells being connected to a selected word line out of the plural word lines and connected to the k bit lines according to the refresh selection address.

9. The semiconductor memory device according to claim 8, wherein
the refresh selection part and the refresh sense amplifier are provided between one group of the sense amplifiers connected to the k bit lines and another group of the sense amplifiers adjacent to the one group of the sense amplifiers, and
contacts connecting the word lines to metal wirings provided on an upper layer than the word lines are provided between a cell array corresponding to the one group of the sense amplifiers and a cell array corresponding to the adjacent group of the sense amplifiers.

10. The semiconductor memory device according to claim 8, wherein
the refresh selection part selects whether to perform the refresh operation using a refresh permission signal for causing the sense amplifiers to execute a data read operation or a data write operation.

11. The semiconductor memory device according to claim 8, further comprising a counter provided to correspond to the plural refresh selection parts, and counting a number of times of executing the refresh operation, wherein
all of the plural refresh selection parts corresponding to the counter perform the refresh operation when the number of times of executing the refresh operation reaches a predetermined value.

12. The semiconductor memory device according to claim 8, wherein
the refresh data is determined based on a length of a retention time which is a term from writing data into the memory cells until the memory cells storing the data therein has a retention defect.

13. The semiconductor memory device according to claim 8, further comprising transfer gates connected between the sense amplifiers and the bit lines, wherein
the refresh selection part selects whether to perform the refresh operation by conductive states of the transfer gates.

* * * * *